United States Patent
Cha et al.

(10) Patent No.: US 7,056,827 B2
(45) Date of Patent: Jun. 6, 2006

(54) METHODS OF FILLING TRENCHES USING HIGH-DENSITY PLASMA DEPOSITION (HDP)

(75) Inventors: Yong-Won Cha, Gyeonggi-do (KR); Kyu-tae Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/917,659

(22) Filed: Aug. 13, 2004

(65) Prior Publication Data
US 2005/0037610 A1  Feb. 17, 2005

(30) Foreign Application Priority Data
Aug. 14, 2003 (KR) .................. 10-2003-0056637

(51) Int. Cl.
*H01L 21/4763* (2006.01)
(52) U.S. Cl. ...................... 438/637; 438/674
(58) Field of Classification Search ............. 438/637, 438/641, 643, 646, 674, 675
See application file for complete search history.

(56) References Cited

U.S. PATENT DOCUMENTS 6,395,150 B1   5/2002 Van Cleemput et al.
2002/0137276 A1 * 9/2002 Park .................. 438/241
2004/0266133 A1 * 12/2004 Kim .................. 438/424

FOREIGN PATENT DOCUMENTS

KR   2002-0044001   6/2002
KR   2003-0002889   1/2003

OTHER PUBLICATIONS

Korean Intellectual Property Office, "Notice to File a Response/Amendment to the Examination Report," corresponding to Korean Patent application 2003-0056637, dated Jun. 27, 2005.

* cited by examiner

*Primary Examiner*—Phuc T. Dang
(74) *Attorney, Agent, or Firm*—Myers Bigel Sibley & Sajovec

(57) ABSTRACT

Methods of filling trenches/gaps defined by circuit elements on an integrated circuit substrate are provided. The methods include forming a first high-density plasma layer on an integrated circuit substrate including at least one trench thereon using a first reaction gas. The first high-density plasma layer is etched using an etch gas including nitrogen fluoride gas ($NF_3$). A second high-density plasma layer is formed on the etched first high-density plasma layer using a second reaction gas including nitrogen fluoride.

26 Claims, 13 Drawing Sheets

METHODS OF FILLING TRENCHES USING HIGH-DENSITY PLASMA DEPOSITION (HDP)

CLAIM OF PRIORITY

This application is related to and claims priority from Korean Patent Application No. 10-2003-56637, filed on Aug. 14, 2003, the disclosure of which is hereby incorporated herein by reference as if set forth in its entirety.

FIELD OF THE INVENTION

The present invention relates to methods of fabricating integrated circuit devices and, more particularly, methods for filling trenches on integrated circuit substrates in integrated circuit devices.

BACKGROUND OF THE INVENTION

As integrated circuit technology advances, circuit elements and interconnections on substrates have become increasingly more dense. In order to reduce the likelihood of unwanted interactions between the circuit elements on the integrated circuit substrate, insulating regions are provided in trenches/gaps located on the integrated circuit substrates to physically and/or electrically isolate the circuit elements and conductive lines associated therewith. However, as circuit densities continue to increase, the widths of the trenches continue to decrease. Thus, aspect ratios, i.e. the height of the trench divided by the width of the trench, of the trenches/gaps continue to increase. As a result, it may become increasingly difficult to fill the narrow trenches, which may lead to unwanted voids and discontinuities in the insulating regions.

Conventional methods of filling trenches having high aspect ratios may include high-density plasma (HDP) oxide deposition. Typical HDP deposition processes employ chemical vapor deposition (CVD) with a gas mixture containing, for example, oxygen, silane, and argon to achieve simultaneous dielectric etching and deposition. In an HDP process, an RF bias may be applied to an integrated circuit substrate in a reaction chamber. Some of the gas molecules (particularly argon) in this gas mixture are ionized in the plasma and accelerate toward the wafer surface when the RF bias is applied to the integrated circuit substrate. Material may thereby be sputtered when the ions strike the surface of the integrated circuit substrate. Accordingly, dielectric material deposited on the surface of the integrated circuit substrate may be simultaneously sputter-etched to enable the trench to remain open during the deposition process.

FIGS. 1A through 1D illustrate, in more detail, the simultaneous etch and deposition (etch/dep) process described above. As illustrated in FIG. 1A, $SiO_2$, formed from silane ($SiH_4$) and oxygen ($O_2$), is deposited on the surface of an integrated circuit substrate 100 to fill the gap/trench 110 between the circuit elements 120. As the $SiO_2$ is deposited, charged ions may impinge on the $SiO_2$ or dielectric layer 125 (FIG. 1B), thereby simultaneously etching the $SiO_2$ layer. However, because the etch rate at about 45° is approximately three to four times the etch rate on the horizontal surface, 45° facets 130 may form at the corners of the circuit elements 120 during the deposition process, as illustrated in FIG. 1B. FIGS. 1C and 1D illustrate a conventional process of filling the gap 110 by the simultaneous etching and deposition of $SiO_2$.

The etch/dep ratio may be optimized such that facets 130 remain at the corners of circuit elements 120 throughout the HDP deposition process. However, as illustrated in FIG. 2A, if the etch/dep ratio is decreased, facets 130 may begin to move away from the corners of the circuit elements 120, and cusps 210 may begin to form on sidewalls of gap/trench 110. Cusp 210 formation may be due to some of the etched $SiO_2$ being redeposited on opposing surfaces through line-of-sight redeposition, even though most of the etched $SiO_2$ is emitted back into the plasma and pumped out of the reaction chamber. This redeposition may increase as the distance between opposing surfaces decreases. Therefore, as the facets 130 move away from the corners of the circuit elements 120, the line-of-sight paths may be shortened, resulting in increased sidewall redeposition. At a certain point in the process, the cusps 210 will meet and may prevent further deposition below the cusps. When this occurs, a void 220 may be created in dielectric layer 125, as illustrated in FIG. 2B. On the other hand, if the etch/dep ratio is increased, the etching component can etch or "clip" material from the corners of elements 120, and thereby possibly damage the circuit elements 120 and introduce etched contaminants 310 into dielectric layer 125 as illustrated in FIGS. 3A and 3B.

The etch/dep ratio may be controlled by varying the flow rate of silane or other process gases, which may affect the deposition rate, or by varying either the power supplied to the wafer for biasing or the flow rate of argon, which may affect the sputter etch rate. Etch rates are typically increased by increasing the flow rate of argon, which is used to promote sputtering, rather than increasing power and expending large amounts of energy. Typical argon flow rates for HDP deposition range from 30%–60% or more of the total process gas flow rate. By optimizing the etch/dep ratio, gaps with aspect ratios of up to about 3.0:1.0 may be filled without void formation. However, as illustrated in FIG. 3B, filling higher gap aspect ratios may result in voids 410 due to cusps 420 prematurely closing the gap/trench even if the etch/dep ratio is optimized to 1 at the element corners. As discussed above, this may be mainly due to the shortened line-of-sight path between opposing sidewalls. If the etch rate is increased to keep the gaps open longer, undesirable corner clipping can occur.

Methods for filling trenches having high aspect ratios are discussed in U.S. Pat. No. 6,395,150 entitled VERY HIGH ASPECT RATIO GAPFILL USING HDP. The method described therein attempts to solve problems associated with the conventional methods discussed above by replacing argon gas with helium gas having a small atomic weight relative to argon gas.

In particular, FIGS. 4A through 4D are cross-sectional views illustrating methods described in U.S. Pat. No. 6,395,150. Referring now to FIG. 4A, circuit elements 520 are formed on an integrated circuit substrate 100. The circuit elements 520 may define gaps/trenches 510 on the integrated circuit substrate 100. The circuit elements 520 may be, for example, transistors, conductors, or interconnects. A trench 510 having a high aspect ratio, typically greater than 2.5:1, is filled using HDP deposition, where sputtering is accomplished with Helium (He) and Oxygen ($O_2$). During the initial stages of the process, 45° facets 530 may form at the corners of circuit elements 520, as illustrated in FIG. 4A. Due to the reduction in the etching component, the facets 530 begin to move away from the corners of circuit elements 520 as more material deposits on the surfaces to form the $SiO_2$ or dielectric layer 525, as illustrated in FIGS. 4B and 4C.

Furthermore, by replacing argon (Ar) with helium (He) the sidewall redeposition may be reduced. Due to the reduction in sputtering component, much less material may be available to redeposit on sidewalls 540 and facets 530, as illustrated in FIGS. 4B and 4C. As a result, cusp formation may be reduced, and the facets 530 may move away more slowly from the corners of the circuit elements 520. Thus, due to the decreased sidewall deposition, high aspect ratio gaps may not close prematurely even though the facets 530 move away from the corners. As illustrated in FIG. 4D, high aspect ratio gaps 510 may be filled without void formation or clipping.

SUMMARY OF THE INVENTION

Embodiments of the present invention provide methods of filling trenches defined by circuit elements on an integrated circuit substrate. The methods include forming a first high-density plasma layer on an integrated circuit substrate including at least one trench thereon using a first reaction gas. The first high-density plasma layer is etched using an etch gas including nitrogen fluoride gas ($NF_3$). A second high-density plasma layer is formed on the etched first high-density plasma layer using a second reaction gas including nitrogen fluoride.

In some embodiments of the present invention, the first reaction gas may include oxygen ($O_2$), silane ($SiH_4$) and an inert gas and the second reaction gas may further include oxygen and silane and be free of an inert gas. The first high-density plasma layer and the second high-density plasma layer may be deposited on the integrated circuit substrate.

In further embodiments of the present invention, the first reaction gas may include a silane gas, an oxygen gas and an argon (Ar) or helium (He) gas. The silane gas may have a flow rate of from about 10 to about 300 standard cubic centimeters per minute (SCCM). The oxygen gas may have a flow rate of from about 10 to about 300 SCCM. The argon gas and/or the helium gas may have a flow rate of from about 0 to about 500 SCCM and a pressure of from about 1.5 to about 5.9 mTorr.

In still further embodiments of the present invention, the etch gas may include an oxygen gas, an argon gas and a nitrogen fluoride gas. The oxygen gas may have a flow rate of from about 10 to about 300 standard cubic centimeters per minute (SCCM). The argon gas may have a flow rate of from about 0 to about 500 SCCM. The nitrogen fluoride gas may have a flow rate of from about 100 to about 500 SCCM. In certain embodiments of the present invention, the etch gas may further include hydrogen ($H_2$) gas.

In some embodiments of the present invention, the first high-density plasma layer may be etched using a chemical dry etching process. The first high-density plasma layer may be etched at a plasma power of from about 3000 to about 5000 Watts and a bias power of from about 0 to about 1500 Watts.

In further embodiments of the present invention, the second high-density plasma layer may be deposited at a temperature of from about 650 to about 800° C. The second reactant gas may include oxygen gas, a silane gas and a nitrogen fluoride gas. The oxygen gas may have a flow rate of from about 10 to about 400 standard cubic centimeters per minute (SCCM). The silane gas may have a flow rate of from about 10 to about 400 SCCM. The nitrogen fluoride gas may have a flow rate of from about 10 to about 300 SCCM.

In still further embodiments of the present invention, a flow-rate ratio of oxygen to silane may be from about 1 to about 2.5. In certain embodiments of the present invention, the flow rate ratio of nitrogen to the second reaction gas ($NF_3/(NF_3+SiH_4+O_2)$) may be from about 0.1 to about 0.5.

In some embodiments of the present invention, a portion of the first high-density plasma layer may be etched before the second high-density plasma layer is formed. The first high-density plasma layer may be wet etched using a nitrogen fluoride solution, an ammonium fluoride ($NH_4F$) and hydrogen fluoride (HF) (LAL) solution and/or a buffered oxide etchant (BOE).

DETAILED DESCRIPTION OF EMBODIMENTS OF THE PRESENT INVENTION

Figure 1A:
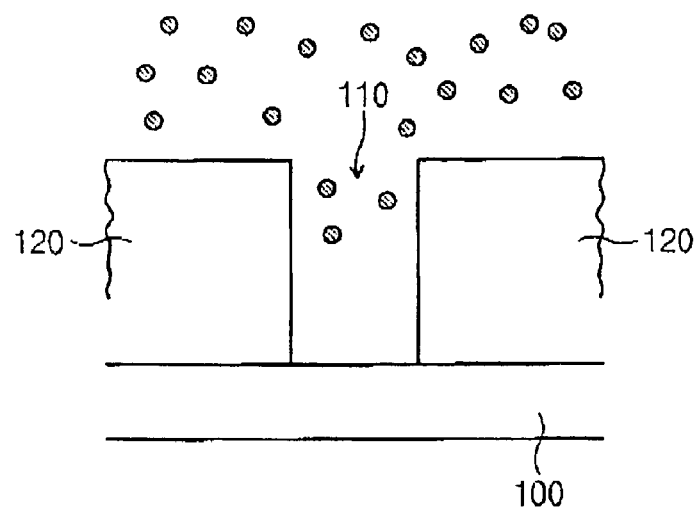
FIGS. 1A through 1D are cross sections illustrating processing steps for filling gaps/trenches according to conventional methods.
Figure 1B:
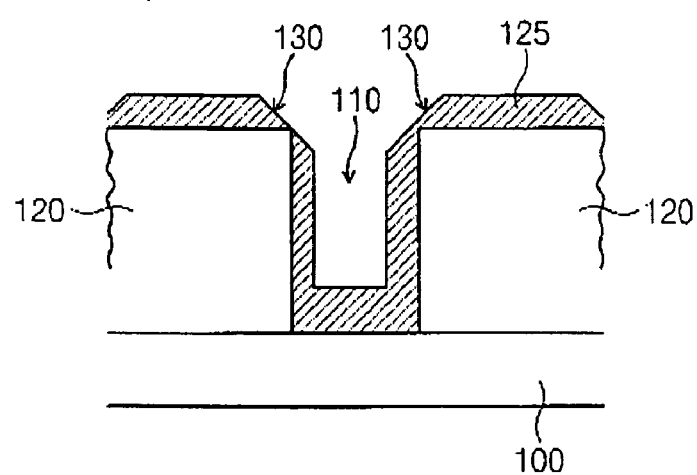
Figure 1C:
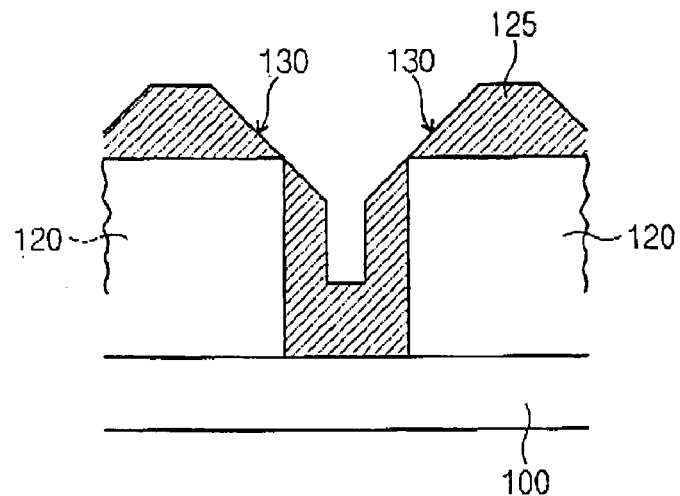
Figure 1D:
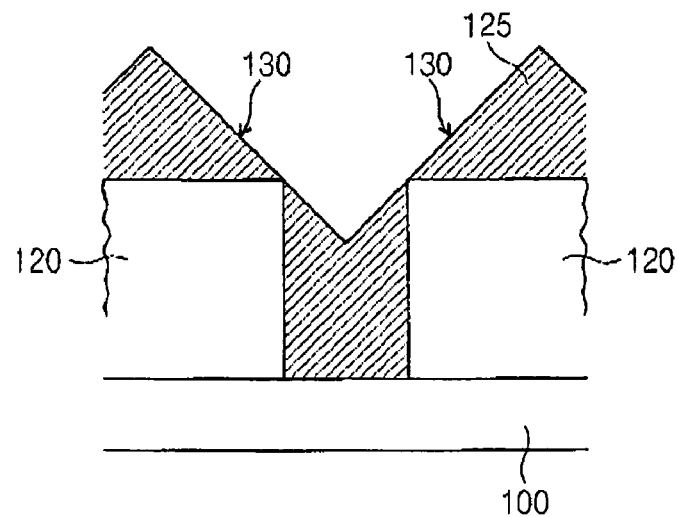
Figure 2A:
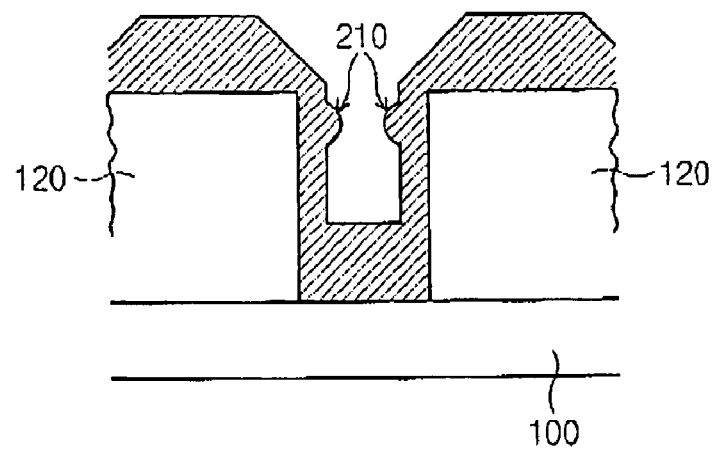
FIGS. 2A and 2B are cross sections illustrating processing steps for filling gaps/trenches according to conventional methods.
Figure 2B:
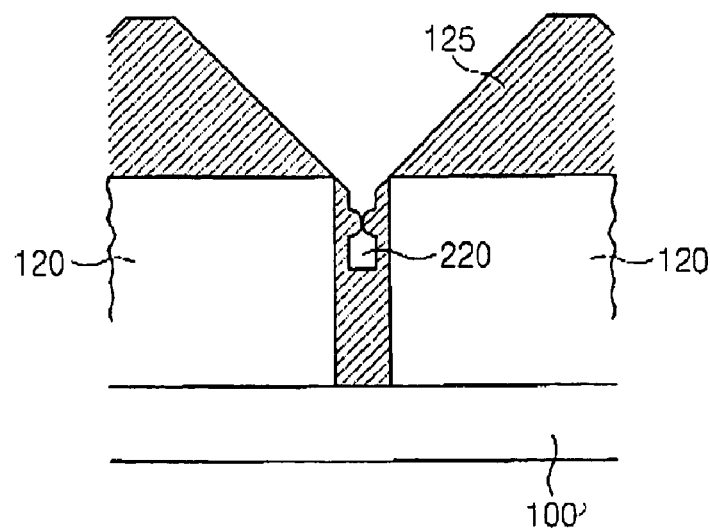
Figure 3A:
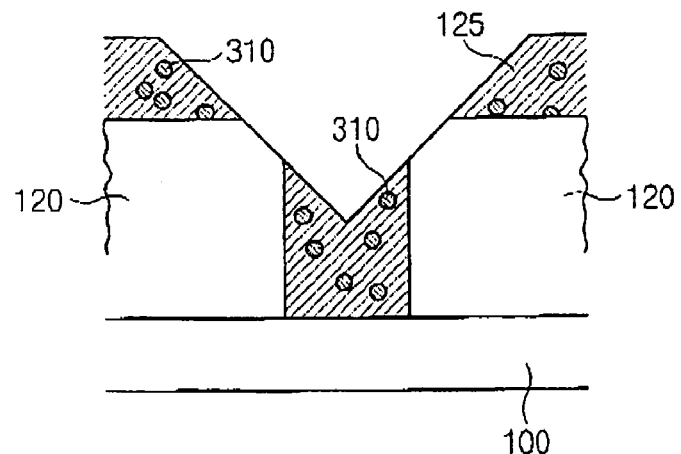
FIGS. 3A and 3B are cross sections illustrating processing steps for filling gaps/trenches according to conventional methods.
Figure 3B:
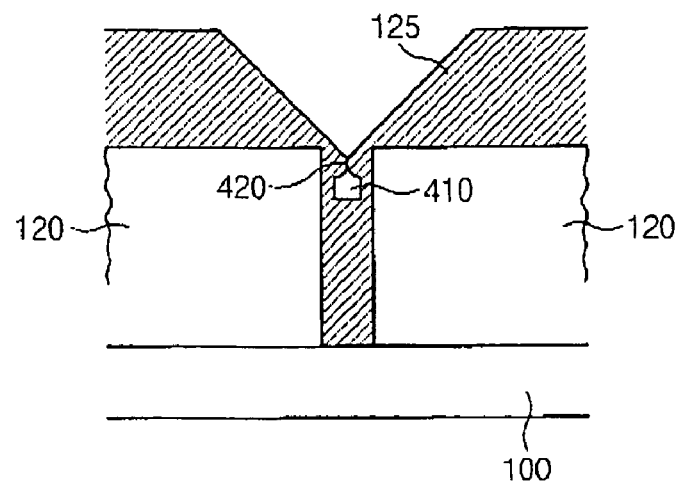
Figure 4A:
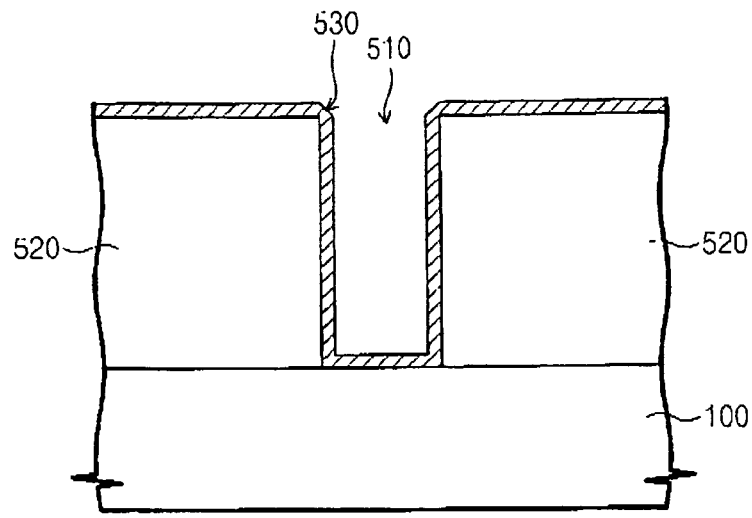
FIGS. 4A through 4D are cross-sectional views illustrating processing steps for filling trenches using a conventional HDP deposition technique.
Figure 4B:
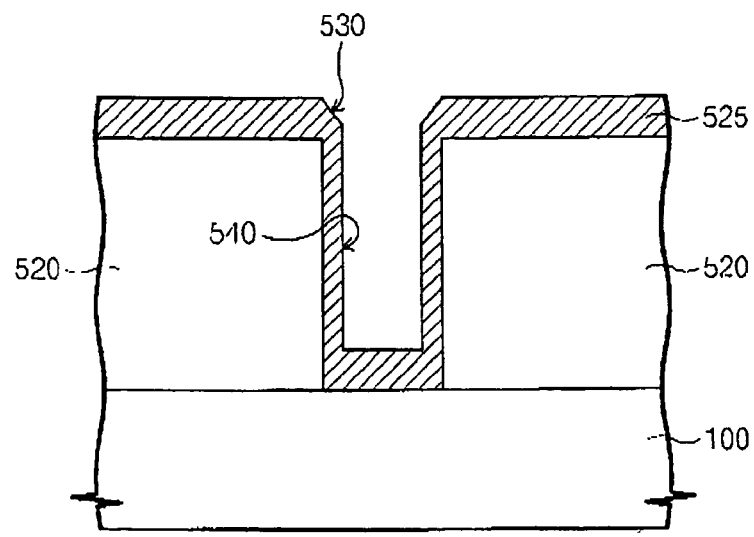
Figure 4C:
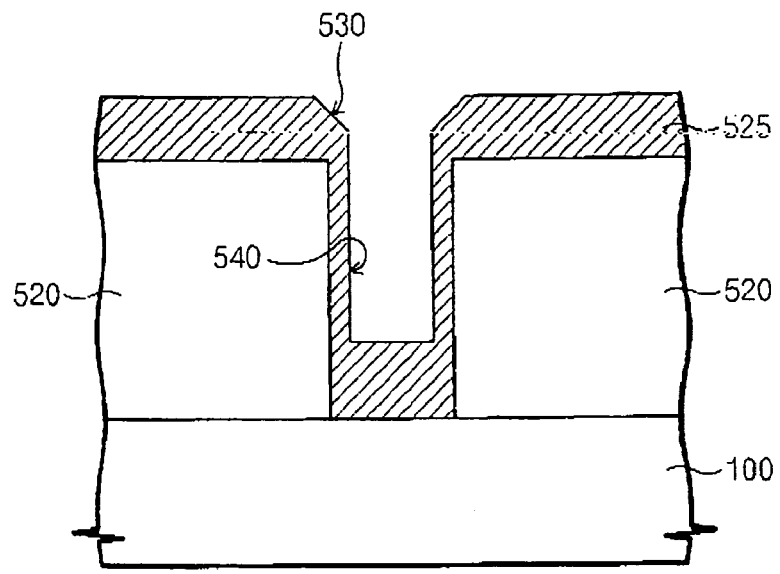
Figure 4D:
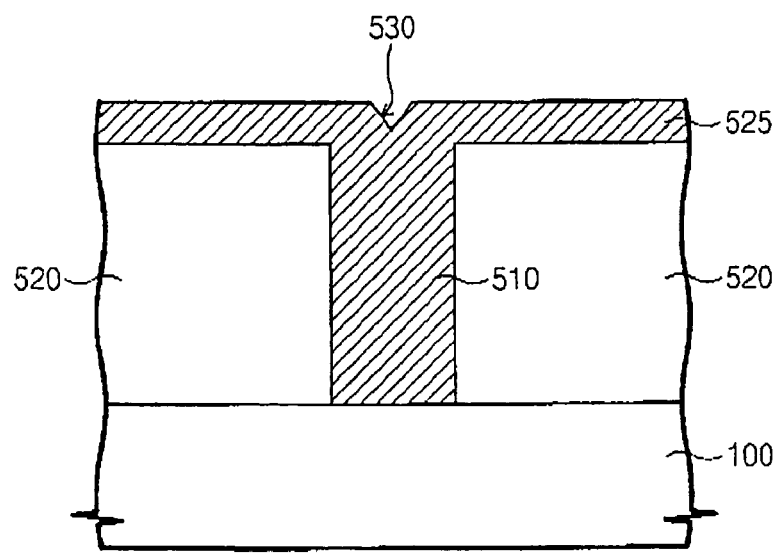

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 5:
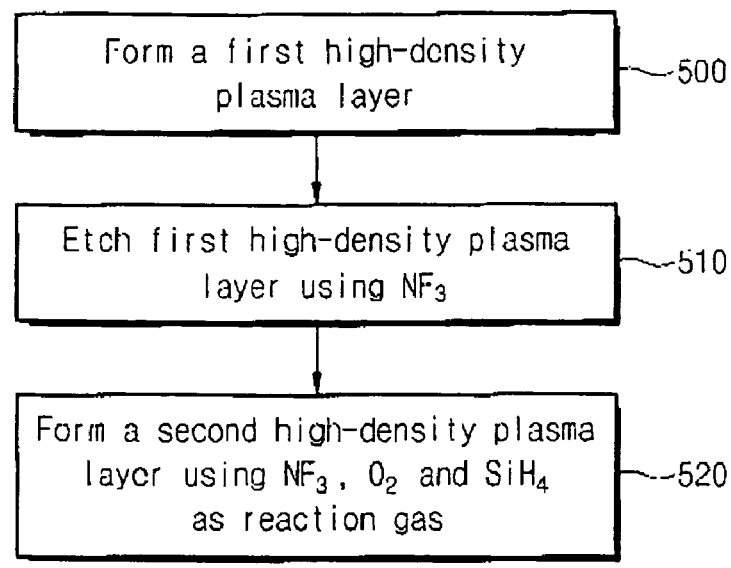
FIG. 5 is a flowchart illustrating processing steps in the fabrication of integrated circuit devices according to some embodiments of the present invention.
Figure 6:
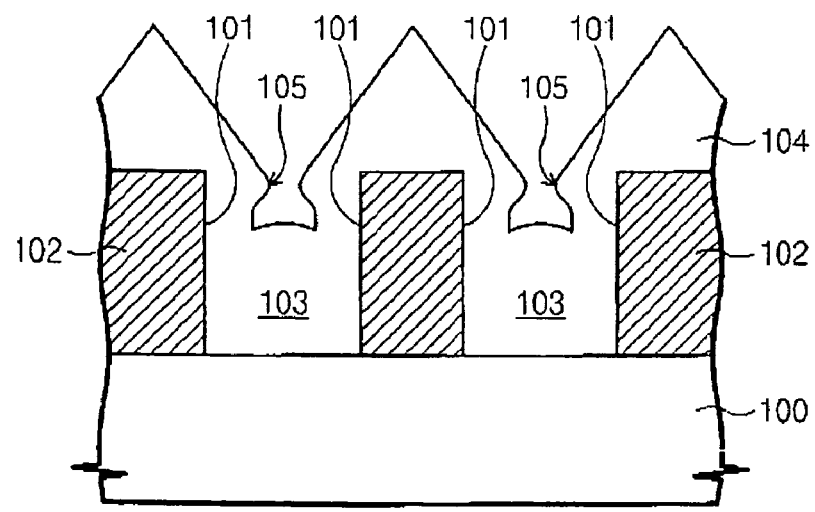
FIGS. 6 through 8 are cross sections further illustrating processing steps in the fabrication of integrated circuit devices according to some embodiments of the present invention.
Figure 7:
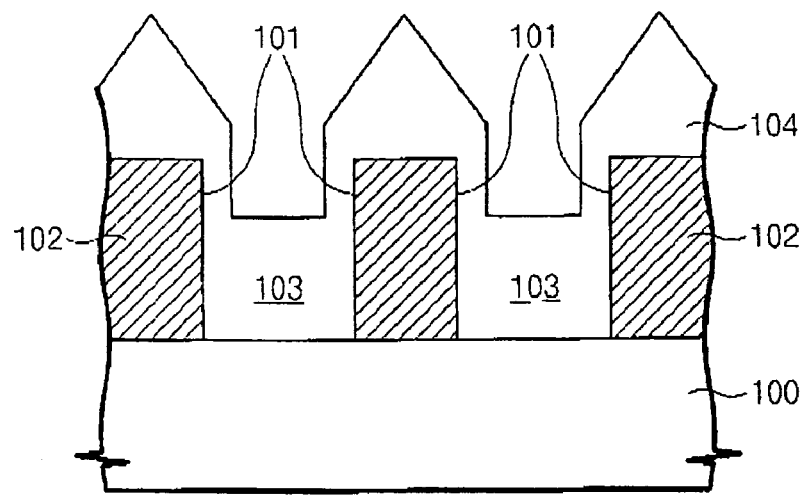
Figure 8:
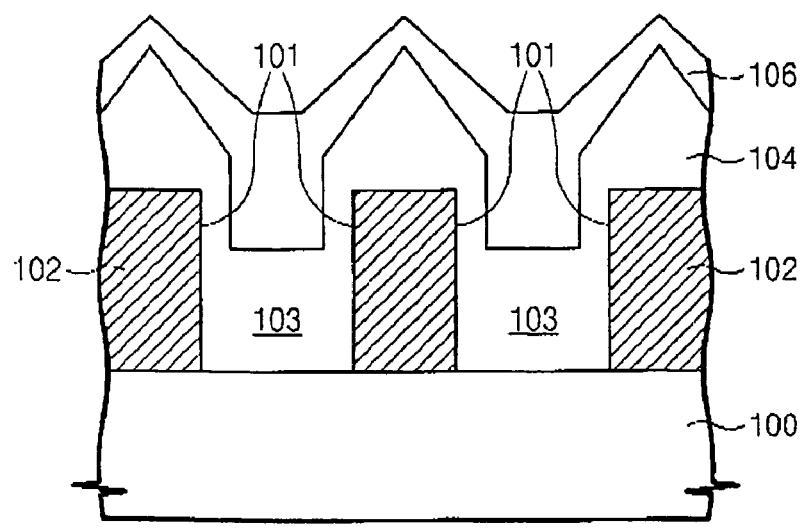

Embodiments of the present invention will be described below with respect to FIGS. 5 through 16. FIG. 5 is a flowchart illustrating a processing steps in the fabrication of integrated circuit devices according to some embodiments of the present invention. FIGS. 6 through 8 are cross sections further illustrating the processing steps in the fabrication of integrated circuit devices according to some embodiments of the present invention.

Referring now to FIGS. 5 and 6, a first high-density plasma layer, for example, a high-density plasma oxide layer, is formed on an integrated circuit substrate (block 500 of FIG. 5). In particular, as illustrated in FIG. 6, a plurality of patterns 102 are formed on an integrated circuit substrate 100. The plurality of patterns 102 may define one or more trenches/gaps 103 on the integrated circuit substrate 100. The plurality of patterns 102 may be, for example, trench patterns used to isolate devices, gate patterns of a transistor, interconnection patterns and the like without departing from the scope of the present invention. A first high-density plasma layer 104 is formed on a surface of the integrated circuit substrate 100. The first high-density plasma layer 104 may be deposited using a first reaction gas including silane ($SiH_4$) and oxygen ($O_2$). For example, in some embodiments of the present invention, the deposition of the first high-density plasma layer 104 may be performed using a reaction gas including: a silane gas having a flow rate of from about 10 to about 300 standard cubic centimeters per minute (SCCM), an oxygen gas having a flow rate of from about 10 to about 300 SCCM, and at least one of a helium (He) gas and an argon (Ar) gas having a flow rate of from about 0 to about 500 SCCM. The deposition of the first high-density plasma layer 104 may be performed at a low pressure of from about 1.5 to about 5.9 mTorr.

In further embodiments of the present invention, the flow-rate ratio of oxygen to silane ($O_2/SiH_4$) may be from about 1.0 to about 2.5, which may allow deposition of a stable oxide layer. In these embodiments of the present invention, a plasma power may be from about 3000 to about 15000 Watts and a bias power may be from about 0 to about 3000 Watts. In practice, the silane and oxygen gases are used in combination with an inert gas, for example, argon or helium, to deposit an insulating layer (oxide layer) on the integrated circuit substrate 100. The helium gas and/or argon gas is supplied and the ions of the oxygen gas collide with a surface of the insulating layer to simultaneously etch the deposited oxide layer by sputtering. During this process, the sputtered oxide layer may be re-deposited on sidewalls 101 of the trenches 103 to generate unwanted overhangs 105 during the deposition of the high-density plasma layer.

In some embodiments of the present invention, the first high-density plasma layer 104 may be formed having a thickness corresponding to 10 to 80 percent of a depth of the trench 103. In addition, an etch ratio with respect to the deposition (E/D ratio) of the first high-density plasma layer 104 may be lowered during the deposition process so as to reduce the likelihood that the corners of the patterns 102 will be clipped during the deposition process. The etch ratio (E/D ratio) may be reduced by decreasing the bias power, or using a gas having a small atomic weight, for example, a helium gas, as an inert gas.

Referring now to FIGS. 5 and 7, the first-high density plasma layer 104 may be etched using an etch gas including nitrogen fluoride ($NF_3$) (block 510 of FIG. 5). In particular, in some embodiments of the present invention, the first high-density plasma layer 104 may be etched using an etch gas including nitrogen fluoride. In these embodiments of the present invention, the first high-density plasma layer 104 may be etched using, for example, a chemical dry etching technique so as to remove the overhang 105 and lower the aspect ratio of the trench 103 including the deposited first high-density plasma layer 104. The chemical dry etching process may be performed by, for example, eliminating the supply of the silane gas into a chamber and providing the nitrogen fluoride gas into the chamber. For example, the etch gas may include: an oxygen gas having a flow rate of from about 10 to about 300 SCCM, an argon gas having a flow rate of from about 0 to about 500 SCCM and a nitrogen fluoride gas having a flow rate of from about 100 to about 500 SCCM. The first high-density plasma layer 104 may be etched at a low pressure of from about 1.5 to about 5.0 mTorr. In some embodiments of the present invention, the plasma power may be from about 3000 to about 5000 Watts and the bias power may be from about 0 to about 1500 Watts. Thus, at least a portion of the first high-density plasma layer 104 may be etched to remove the overhang 105. In particular, the first high-density plasma layer 104 may be etched from about 1 to about 30 percent of the thickness thereof to reduce the likelihood that underlying patterns 102 will be clipped.

Referring now to FIGS. 5 and 8, a second high-density plasma layer may be formed using a second reaction gas including nitrogen fluoride, oxygen and silane (block 520 of FIG. 5). In particular, a second high-density plasma layer 106 is deposited on the first high-density plasma layer 104 using a reaction gas including nitrogen fluoride. The second high-density plasma layer 106 may be formed to fill the remaining portion of the trench 103, if any. In some embodiments of the present invention, the second high-density plasma layer 106 may be formed using a second reaction gas including nitrogen fluoride, oxygen and silane gases. In these embodiments of the present invention, an inert gas may not be provided during the deposition of the second high-density plasma layer 106. The second high-density plasma layer 106 is deposited and simultaneously chemically etched by the nitrogen fluoride gas provided as part of the deposition process. Accordingly, even if a slight overhang 105 is formed by the oxygen gas, the overhang 105 may be removed by the nitrogen fluoride.

In some embodiments of the present invention, hydrogen ($H_2$) gas may be added to the etch gas. The diffusion of hydrogen on the surface of the high-density plasma layer may cause the sputtered radicals to combine with the hydrogen and, therefore, may not be re-deposited to form the overhang 105.

The second reaction gas includes an oxygen gas having a flow rate of from about 10 to about 400 SCCM, a silane gas having a flow rate of from about 10 to about 400 SCCM and a nitrogen fluoride having a flow rate of from about 10 to about 300 SCCM. The deposition may be performed under a low pressure of from about 1.5 to about 5.0 mTorr. To perform the sputtering and the etching simultaneously, a bias power of about 5000 Watts and a plasma power of from about 3000 to about 15000 Watts may be applied to drive plasma. During deposition of the second high-density plasma layer 106, the nitrogen fluoride gas may attack sidewalls 101 of the trench. However, the likelihood of this may be reduced by increasing a temperature of the deposition process. For example, the second high-density plasma layer 106 may be deposited at a temperature of from about 650 to about 800° C. In some embodiments of the present invention, a flow-rate ratio of oxygen to silane ($O_2/SiH_4$) may be from about 1.0 to about 2.5, which may provide a stable oxide layer. Furthermore, a flow-rate ratio of nitrogen fluoride to the second reactant gas ($(NF_3)/(NF_3+SiH_4+O_2)$) may be from about 0.1 to about 0.5 during the etching using nitrogen fluoride gas and the deposition of the oxygen and silane gases.

Figure 9:
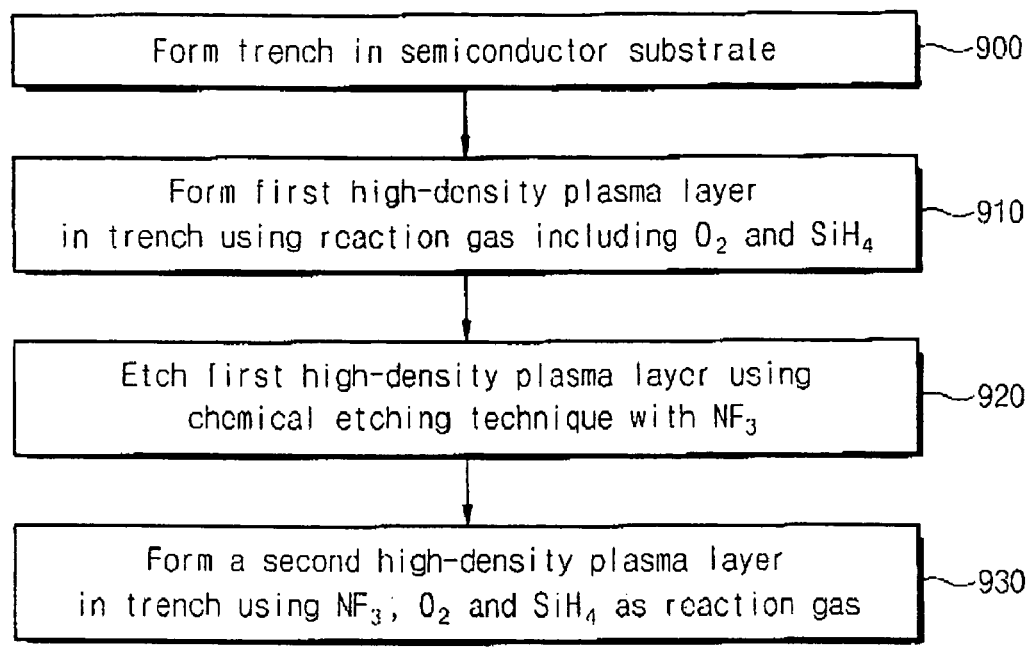
FIG. 9 is a flowchart illustrating processing steps in the fabrication of integrated circuit devices according to further embodiments of the present invention

Referring now to FIGS. 9 through 13. As illustrated therein, embodiments of the present invention may be included in trench isolation methods for providing an insulting layer in a trench region having a high aspect ratio. FIG. 9 is a flowchart illustrating processing steps in the fabrication of integrated circuit devices according to further embodiments of the present invention. FIGS. 10 through 13 are cross sections further illustrating processing steps in the fabrication of integrated circuit devices according to further embodiments of the present invention.

Figure 10:
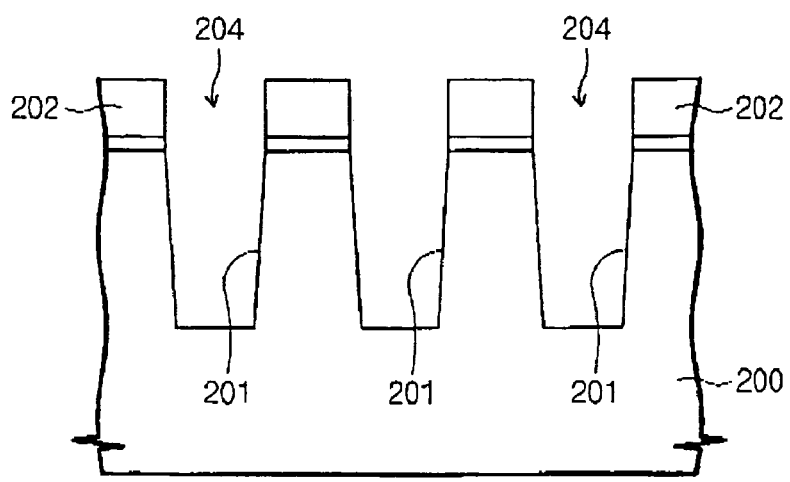
FIGS. 10 through 13 are cross sections further illustrating processing steps in the fabrication of integrated circuit devices according to further embodiments of the present invention.

Referring now to FIGS. 9 and 10, one or more trenches 204 are formed in an integrated circuit substrate 200 (block 900 of FIG. 9). In particular, a hard mask layer 202 is formed on the integrated circuit substrate 200, and the hard mask layer 202 and the substrate 200 are etched to form one or more trenches 204. In some embodiments of the present invention, a thermal oxidation process for curing etch damage may be performed after forming of the trenches 204, and a nitride liner (not shown) may be formed on a surface of the substrate 200.

Figure 11:
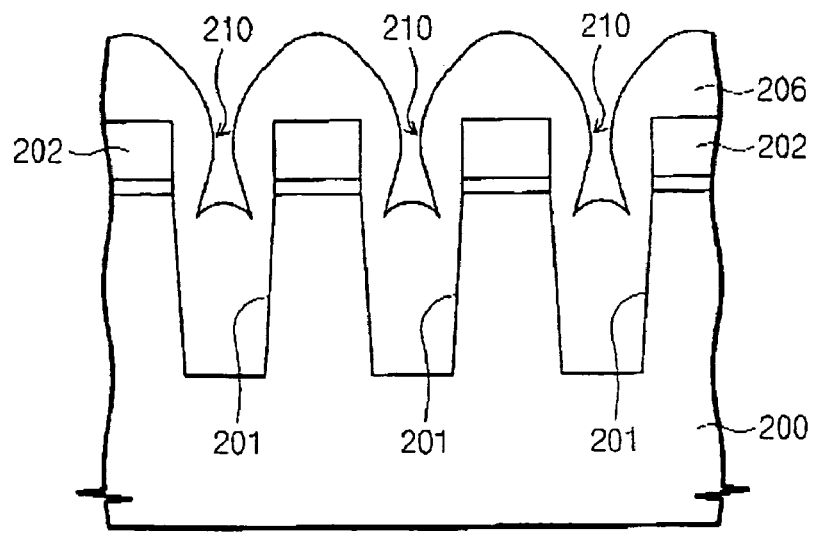

Referring now to FIGS. 9 and 11, the first high-density plasma layer may be formed on the integrated circuit substrate 200 and in the trenches 204 using a reaction gas including oxygen and silane (block 910 of FIG. 9). In particular, the first high-density plasma layer 206 is formed on the integrated circuit substrate 200 including the trench 204. The first high-density plasma layer 206 may be deposited using a reaction gas including a silane gas, an oxygen gas and one of a helium gas and an argon gas. The silane gas may have a flow rate of from about 10 to about 300 SCCM, the oxygen gas may have a flow rate of from about 10 to about 300 SCCM, and the helium and/or argon gases may have a flow rate of from about 0 to about 500 SCCM. The deposition of the first high-density plasma layer 206 may be performed at a low pressure of from about 1.5 to about 5.0 mTorr. In some embodiments of the present invention, a flow-rate ratio of oxygen to silane ($O_2/SiH_4$) may be from about 1.0 to about 2.5, which may provide a stable oxide layer. During the deposition of the first high-density plasma layer 206, a plasma power of from about 3000 to about 15000 Watts and a bias power of from about 0 to about 3000 Watts may be applied to drive plasma. The oxide layer sputtered during the deposition process of the high-density plasma layer may be re-deposited on opposing sidewalls 201 of the trenches 204 to form unwanted overhangs 210 at entrances of the trenches 204. In some embodiments of the present invention, the high-density plasma layer 206 may be formed having a thickness corresponding to from 10 to about 80 percent of the depth of trench 204.

Figure 12:
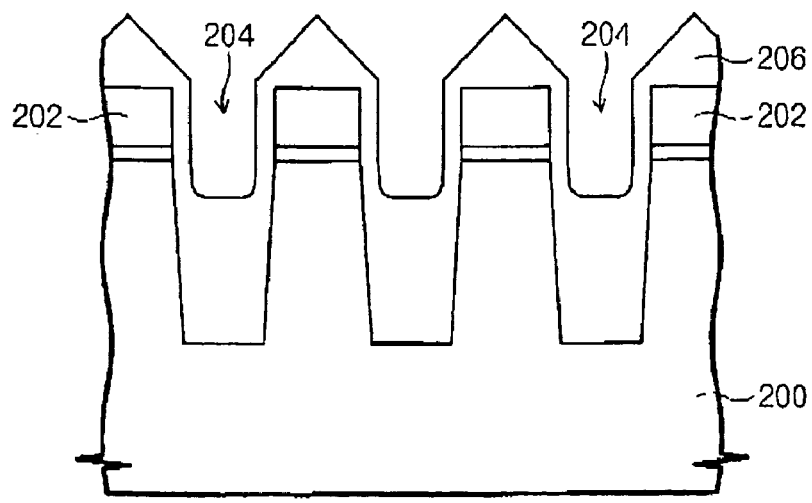

Referring now to FIGS. 9 and 12, the first high-density plasma layer 206 may be etched using a chemical etching process including nitrogen fluoride gas (block 930 of FIG. 9). In particular, at least a portion of the first high-density plasma layer 206 is etched using an etch gas including nitrogen fluoride. In some embodiments of the present invention, the high-density plasma layer 206 may be etched using a chemical dry etching process to remove the overhang 210 and to lower the aspect ratio of the trench 204 including the first high-density plasma layer 206. The chemical dry etching process may be performed by, for example, eliminating a supply of the silane gas into a chamber and providing the nitrogen fluoride gas into the chamber having a flow rate of from about 100 to about 500 SCCM when the first high-density plasma layer 206 is formed to a predetermined thickness. The chemical dry etching process may be performed at a low pressure of from about 1.5 to about 5.0 mTorr. In some embodiments of the present invention, a plasma power of from about 3000 to about 5000 Watts may be applied, and a bias power of from about 0 to about 1500 Watts may be applied. The overhang 210 may be removed by etching a portion of the first high-density plasma layer 206. In some embodiments of the present invention, from about 1% to about 30% of the first high-density plasma layer 206 may be etched so as to reduce the likelihood that other layers of the integrated circuit device may be damaged.

Figure 13:
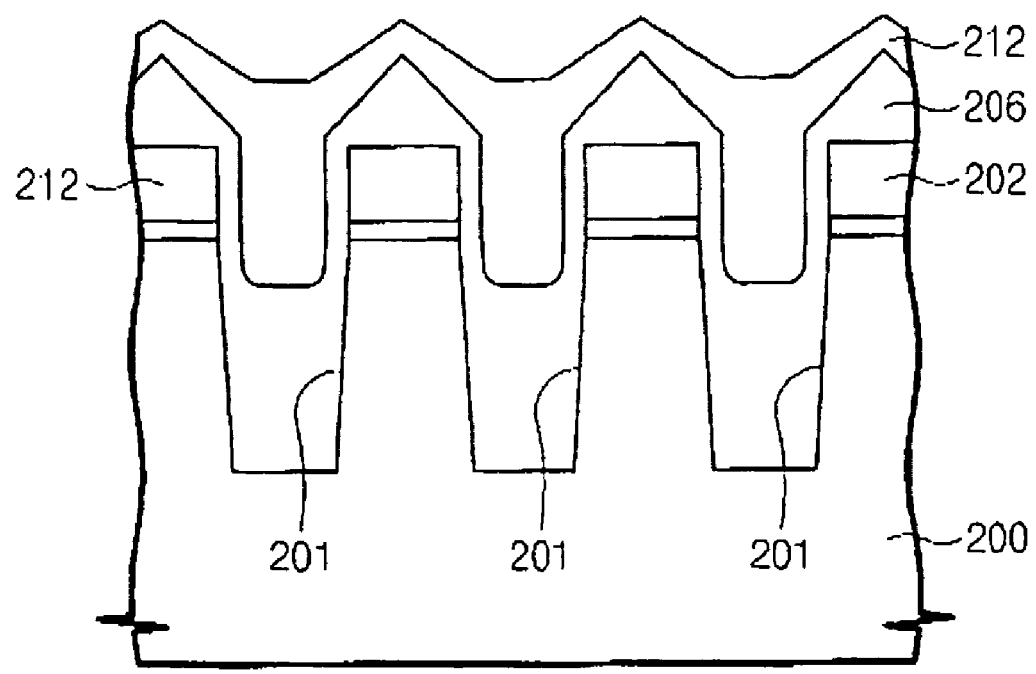

Referring now to FIGS. 9 and 13, a second high-density plasma layer may be formed on the first high-density plasma layer using a reaction gas including nitrogen fluoride, oxygen and silane (block 930 of FIG. 9). In particular, a reaction gas including nitrogen fluoride may be used in depositing a second high-density plasma layer 212 on the first high-density plasma layer 206. The second high-density plasma layer 212 may be formed in the remaining portion of the trench 204. The second high-density plasma layer 212 may be formed using a nitrogen fluoride gas, an oxygen gas and a silane gas as a reaction gas. In some embodiments of the present invention, an inert gas may not be provided when the second high-density plasma layer 212 is deposited. Not using an inert gas in the deposition process of the second high-density plasma layer may reduce the likelihood that re-deposition by sputtering will occur and form overhangs. The nitrogen fluoride gas supplied during the deposition simultaneously etches and deposits the second high-density plasma layer 212. Therefore, even if an overhang is formed due to the oxygen gas, it may be removed during the deposition process. In some embodiments of the present invention, hydrogen gas may be added to the etch gas, which may reduce the likelihood of the formation of overhangs as discussed above. In particular, if hydrogen is diffused on a surface of the plasma layer capable of causing an overhang, the sputtered radical may combine with the hydrogen and therefore reduce the likelihood of re-deposition.

A reaction gas including an oxygen gas having a flow rate of from about 10 to about 400 SCCM, a silane gas having a flow rate of from about 10 to about 400 SCCM and a nitrogen fluoride gas having a flow rate of from about 10 to about 300 SCCM may be supplied. The deposition may be carried out at a low pressure of from about 1.5 to about 5.0 mTorr. Plasma may be driven by applying a bias power of from about 10 to about 5000 Watts and a plasma power of from about 3000 to about 15000 Watts so that the sputtering and etching may be performed simultaneously. During deposition of the second high-density plasma layer, sidewalls 201 of the trench 204 may be attacked by the nitrogen fluoride gas. However, the likelihood that the nitrogen fluoride gas will attack the sidewalls 201 of the trench may be reduced by increasing a temperature of the deposition process. For instance, the second high-density plasma layer 212 may be deposited at a temperature of from 650 to about 800° C. In some embodiments of the present invention, a flow-rate ratio of oxygen to silane ($O_2/SiH_4$) may be maintained at from about 1.0 to about 2.5 to form a stable oxide layer, and a flow-rate ratio of nitrogen fluoride to the reactant gas (($NF_3$)/($NF_3+SiH_4+O_2$)) may be maintained at from about 0.1 to about 0.5 to perform the etching by the nitrogen fluoride gas and the deposition of the oxygen and silane gases adequately.

According to some embodiments of the present invention, the deposition of the first and second high-density plasma layers may be carried out in an identical chamber in situ. After the first high-density plasma layer is deposited, a supply of the silane gas may be stopped and the nitrogen fluoride gas may be provided to etch the first high-density plasma layer. After the first high-density plasma layer is etched for a predetermined time, a second high-density plasma layer may be formed by providing the silane gas and stopping a supply of the inert gas, for example, argon or helium. Alternatively, each of the steps of the process may be performed in separate chambers, which may improve throughput. Using a separate chamber may be advantageous because the deposition and the etching of the first high-density plasma layer and the deposition of the second high-density plasma layer may be performed simultaneously.

Figure 14:
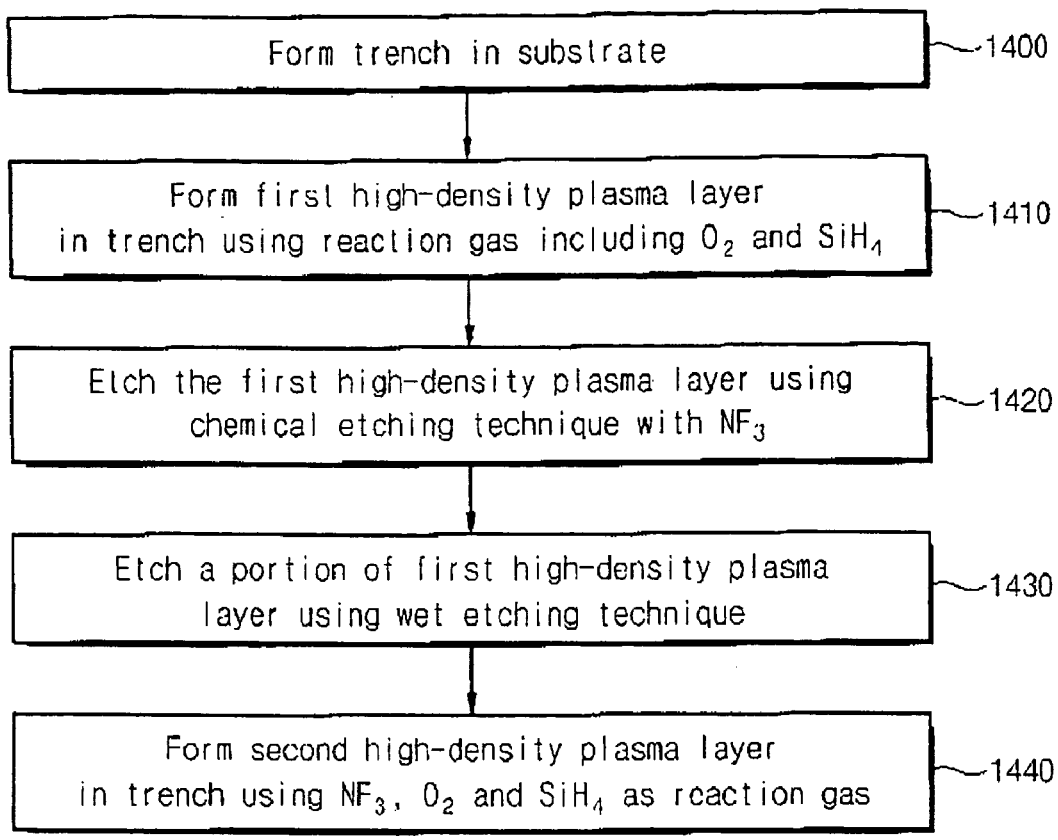
FIG. 14 is a flowchart illustrating processing steps in the fabrication of integrated circuit devices according to still further embodiments of the present invention.
Figure 15:
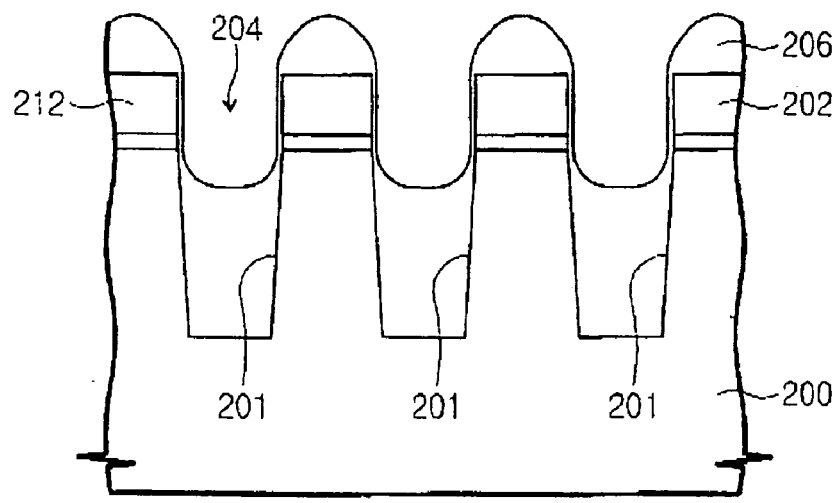
FIGS. 15 and 16 are cross sections further illustrating processing steps in the fabrication of integrated circuit devices according to still further embodiments of the present invention.
Figure 16:
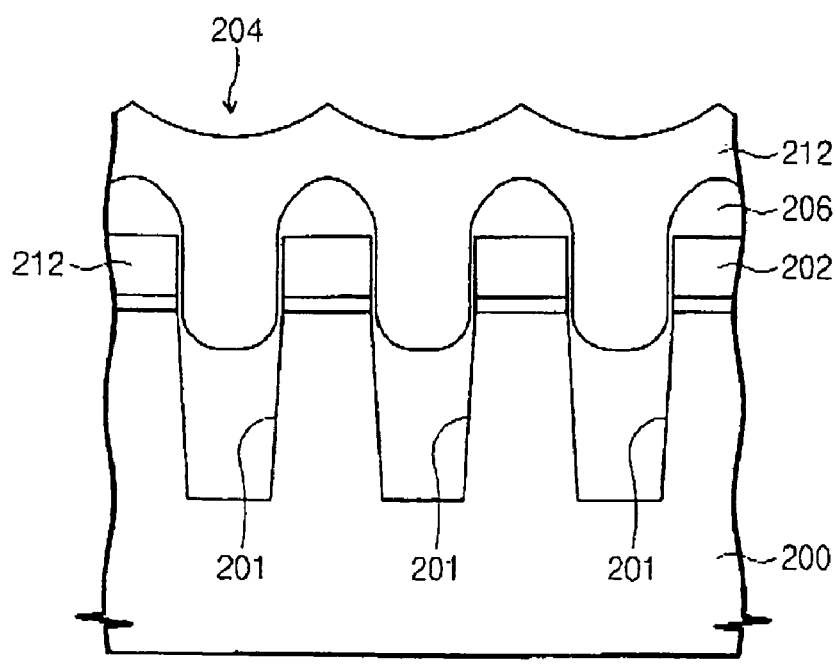

Referring now to FIGS. 14 through 16. FIG. 14 is a flowchart illustrating processing steps in the fabrication of integrated circuit devices according to further embodiments of the present invention. FIGS. 15 and 16 are cross sections further illustrating processing steps in the fabrication of integrated circuit devices according to embodiments of the present invention. The details with respect to blocks 1400, 1410 and 1420 of FIG. 14 are similar to the details discussed above with respect to blocks 900, 910 and 920 of FIG. 9 and will not be discussed further herein.

Referring now to FIGS. 14 and 15, at least a portion of the first high-density plasma layer may be chemically etched using the nitrogen fluoride gas and at least a portion of the first high-density plasma layer may be wet etched (block 1430 of FIG. 14). In particular, at least a portion of the first high-density plasma layer 206 is chemically etched using the nitrogen fluoride gas and at least a portion of the first high-density plasma layer 206 is wet etched. Accordingly, an aspect ratio of the trench 204 may be lowered and a surface of the first high-density plasma layer 206 on the hard mask layer 202 may be rounded as illustrated in FIG. 15. The rounded first high-density plasma layer 206 may reduce the likelihood of re-deposition of the sputtered oxide layer during a subsequent high-density plasma (HDP) deposition processes. The wet etching may be carried out using, for example, a hydrofluoric acid (HF), a solution mixture of $NH_4F$ and HF (LAL) and/or a buffered oxide etchant (BOE).

Referring now to FIGS. 14 and 16, the second high-density plasma layer may be formed in the trench using nitrogen fluoride, oxygen and silane (block 1440 of FIG. 14). In particular, a second high-density plasma layer 212 is deposited on the first high-density plasma layer 206 using a reaction gas including nitrogen fluoride. The second high-density plasma layer 212 may be formed in the remaining portion of the trench 204. The second high-density plasma layer 212 may be formed using a nitrogen fluoride gas, an oxygen gas, and a silane gas as a reaction gas. During deposition of the second high-density plasma layer 212, an inert gas may not be provided. Not using an inert gas during deposition of the second high-density plasma layer may reduce the likelihood of re-deposition due to the sputtering. The second high-density plasma layer 212 may be etched simultaneously with deposition due to the nitrogen fluoride provided during the deposition. Therefore, even if an overhang forms due to an oxygen gas, it may be removed to improve a gap-fill efficiency because the etching by the nitrogen fluoride gas is simultaneously performed. In some embodiments of the present invention, hydrogen may be diffused on a surface of the plasma layer capable of generating the overhang and any sputtered radicals may combine with the hydrogen, which may reduce the likelihood of re-deposition.

An oxygen gas having a flow rate of from about 10 to about 400 SCCM, a silane gas having a flow rate of from about 10 to about 400 SCCM and a nitrogen fluoride gas having a flow rate of from about 10 to about 300 SCCM are supplied as the reaction gas. The deposition may be carried out under a low pressure of from about 1.5 to about 5.0 mTorr. In some embodiments of the present invention, a bias power of from about 10 to about 5000 Watts and a plasma power of from about 3000 to about 15000 Watts are applied to drive plasma such that the deposition, the sputtering and the etching are performed at the same time. During deposition of the second high-density plasma layer 212, sidewalls 201 of the trench may be attacked by the nitrogen fluoride gas. However, the likelihood that the nitrogen fluoride gas may be attacked may be reduced by increasing a temperature of the deposition process. For example, the second high-density plasma layer 212 may be deposited at a temperature of from about 650 to about 800° C. In some embodiments of the present invention, a flow-rate ratio of oxygen to silane ($O_2/SiH_4$) may be maintained at from about 1.0 to about 2.5 to form a stable plasma layer, and a flow-rate ratio of nitrogen fluoride to the reactant gas (($NF_3$)/($NF_3+SiH_4+O_2$)) may be maintained at from about 0.1 to about 0.5 to perform the etching by the nitrogen fluoride gas and the deposition of the oxygen and silane gases adequately.

Some embodiments of the present invention provide methods of filling gaps/trenches having high aspect ratios with an insulating layer, for example, an oxide layer. In particular, a first high-density plasma layer is formed and a portion of the first high-density plasma layer is removed. A second high-density plasma layer is formed on the first high-density plasma layer in the remaining portion of the gap/trench using a reaction gas including nitrogen fluoride. Accordingly, the likelihood of forming an unwanted overhang may be reduced during formation of the high-density plasma layer in the gap/trench as discussed above with respect to FIGS. 5 through 16.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of filling trenches, the method comprising:
    forming a first high-density plasma layer on an integrated circuit substrate including at least one trench thereon using a first reaction gas;
    etching the first high-density plasma layer using an etch gas including nitrogen fluoride ($NF_3$) gas; and
    forming a second high-density plasma layer on the etched first high-density plasma layer using a second reaction gas including nitrogen fluoride.

2. The method of claim 1 wherein the first reaction gas comprises oxygen ($O_2$), silane ($SiH_4$) and an inert gas and wherein the second reaction gas further comprises oxygen, silane and is free of an inert gas.

3. The method of claim 1 wherein forming the first high-density plasma layer comprises depositing the first high-density plasma oxide layer and wherein forming the second high-density plasma layer comprises depositing the second high-density plasma oxide layer.

4. The method of claim 3 wherein the first reaction gas comprises:
    a silane gas having a flow rate of from about 10 to about 300 standard cubic centimeters per minute (SCCM);
    an oxygen gas having a flow rate of from about 10 to about 300 SCCM; and
    at least one of an argon (Ar) gas and a helium (He) gas having a flow rate of from about 0 to about 500 SCCM.

5. The method of claim 1 wherein the etch gas comprises:
    an oxygen gas having a flow rate of from about 10 to about 300 standard cubic centimeters per minute (SCCM);
    an argon (Ar) gas having a flow rate of from about 0 to about 500 SCCM; and
    a nitrogen fluoride gas having a flow rate of from about 100 to about 500 SCCM.

6. The method of claim 5 wherein the etch gas further comprises hydrogen ($H_2$) gas.

7. The method of claim 1 wherein etching the first high-density plasma layer comprises etching the first high-density plasma layer using a chemical dry etching process.

8. The method of claim 1 wherein etching of the first high-density plasma layer comprises etching the first high-density plasma layer at a plasma power of from about 3000 to about 5000 Watts and a bias power of from about 0 to about 1500 Watts.

9. The method of claim 1 wherein forming of the second high-density plasma layer comprises depositing the second high-density plasma layer at a temperature of from about 650 to about 800° C.

10. The method of claim 1 wherein the second reactant gas comprises:
    an oxygen gas having a flow rate of from about 10 to about 400 standard cubic centimeters per minute (SCCM);
    a silane gas having a flow rate of from about 10 to about 400 SCCM; and
    a nitrogen fluoride gas having a flow rate of from about 10 to about 300 SCCM.

11. The method of claim 10 wherein a flow-rate ratio of oxygen to silane is from about 1 to about 2.5.

12. The method of claim 10 wherein a flow-rate ratio of nitrogen fluoride to the second reaction gas ($NF_3$/($NF_3+SiH_4+O_2$)) is from about 0.1 to about 0.5.

13. The method of claim of 1 wherein etching further comprises wet etching a portion of the first high-density plasma layer before forming the second high-density plasma layer.

14. The method of claim 13 wherein wet etching comprises wet etching the first high-density plasma layer using a nitrogen fluoride solution, a ammonium fluoride ($NH_4F$) and hydrogen fluoride (HF) (LAL) solution and/or a buffered oxide etchant (BOE).

15. A method of filling trenches, the method comprising:
    forming a first high-density plasma layer on an integrated circuit substrate including at least one trench thereon using a first reaction gas including oxygen ($O_2$) and silane ($SiH_4$);
    partially etching the first high-density plasma layer by chemically dry etching the first-high-density plasma layer using an etch gas including oxygen and nitrogen fluoride ($NF_3$); and
    forming a second high-density plasma layer on the first high-density plasma layer using a second reaction gas including oxygen, silane and nitrogen fluoride at a temperature of from about 650 to about 800° C.

16. The method of claim 15 wherein the first reaction gas further comprises an inert gas and wherein the second reaction gas is free of an inert gas.

17. The method of claim 15 wherein forming the first high-density plasma layer comprises depositing the first high-density plasma oxide layer and wherein forming the second high-density plasma layer comprises depositing the second high-density plasma oxide layer.

18. The method of claim 17 wherein the first reaction gas comprises:
    a silane gas having a flow rate of from about 10 to about 300 standard cubic centimeters per minute (SCCM);
    an oxygen gas having a flow rate of from about 10 to about 300 SCCM; and
    at least one of an argon (Ar) gas and a helium (He) gas having a flow rate of from about 0 to about 500 SCCM.

19. The method of claim 15 wherein the etch gas comprises:
    an oxygen gas having a flow rate of from about 10 to about 300 standard cubic centimeters per minute (SCCM);
    an argon (Ar) gas having a flow rate of from about 0 to about 500 SCCM; and a nitrogen fluoride gas having a flow rate of 100 to 500 SCCM.

20. The method of claim 19 wherein the etch gas further comprises hydrogen (H2) gas.

21. The method of claim 15 wherein etching of the first high-density plasma layer further comprises etching the first high-density plasma layer at a plasma power of from about 3000 to about 5000 Watts and a bias power of from about 0 to about 1500 Watts.

22. The method of claim 15 wherein the second reactant gas comprises:
an oxygen gas having a flow rate of from about 10 to about 400 standard cubic centimeters per minute (SCCM);
a silane gas having a flow rate of from about 10 to about 400 SCCM; and
a nitrogen fluoride gas having a flow rate of from about 10 to about 300 SCCM.

23. The method of claim 22 wherein a flow-rate ratio of oxygen to silane is from about 1 to about 2.5.

24. The method of claim 22 wherein a flow-rate ratio of nitrogen fluoride to the second reaction gas ($NF_3/(NF_3+SiH_4+O_2)$) is from about 0.1 to about 0.5.

25. The method of claim of 15 wherein etching further comprises wet etching a portion of the first high-density plasma layer before forming the second high-density plasma layer.

26. The method of claim 25 wherein wet etching comprises wet etching the first high-density plasma layer using a nitrogen fluoride solution, a ammonium fluoride ($NH_4F$) and hydrogen fluoride (HF) (LAL) solution and/or a buffered oxide etchant (BOE).

* * * * *